United States Patent [19]
Horiuchi

[11] Patent Number: 6,147,386
[45] Date of Patent: *Nov. 14, 2000

[54] SEMICONDUCTOR DEVICE AND METHOD OF PRODUCING THE SAME

[75] Inventor: Tadahiko Horiuchi, Tokyo, Japan

[73] Assignee: NEC Corporation, Tokyo, Japan

[*] Notice: This patent is subject to a terminal disclaimer.

[21] Appl. No.: 09/352,209

[22] Filed: Jul. 13, 1999

Related U.S. Application Data

[63] Continuation of application No. 08/694,938, Aug. 9, 1996, Pat. No. 5,990,521.

[30] Foreign Application Priority Data

Aug. 16, 1995 [JP] Japan ..................................... 7-230729

[51] Int. Cl.7 ............................ H01L 27/02; H01L 29/48
[52] U.S. Cl. ......................... 257/369; 257/476; 257/481; 257/482; 365/175; 365/177
[58] Field of Search .................................. 257/369, 476, 257/481, 372; 365/175, 177

[56] References Cited

U.S. PATENT DOCUMENTS

| | | | |
|---|---|---|---|
| 4,903,087 | 2/1990 | Jerome et al. | 257/477 |
| 5,061,981 | 10/1991 | Hall | 257/477 |
| 5,260,594 | 11/1993 | Shimizu | 257/369 |

FOREIGN PATENT DOCUMENTS

| | | |
|---|---|---|
| 54-131890 | 10/1979 | Japan . |
| 64-11359 | 1/1989 | Japan . |
| 382151 | 4/1991 | Japan . |
| 4-296020 | 10/1992 | Japan . |
| 5108194 | 4/1993 | Japan . |
| 6-163823 | 6/1994 | Japan . |
| 7-142605 | 6/1995 | Japan . |

OTHER PUBLICATIONS

"1V, 10MHz High–Speed Digital Circuit Technology with Multi–Threshold CMOS." Techincal Report Of IEICE. ICD93–107, Oct. 1993, pp. 23–27.

Primary Examiner—Leo P. Picard
Assistant Examiner—Hung Van Doung
Attorney, Agent, or Firm—Sughrue, Mion, Zinn, Macpeak & Seas, PLLC

[57] ABSTRACT

A semiconductor device of the present invention is a semiconductor device of a complementary MIS field effect transistor, wherein an anode of a first diode is connected to a silicon substrate of a first conduction type while a cathode of the first diode is connected to a first power supply while a cathode of a second diode is connected to a well of the other conduction type and an anode of the second diode is connected to a second power supply.

4 Claims, 9 Drawing Sheets

SEMICONDUCTOR DEVICE AND METHOD OF PRODUCING THE SAME

This is a continuation of application Ser. No. 08/694,938 filed Aug. 9, 1996, now U.S. Pat. No. 5,990,521 the disclosure of which is incorporated herein by reference.

BACKGROUND OF THE INVENTION

1. Field of Invention

This invention relates to a semiconductor device and a method of producing the same, and more particularly to a semiconductor device which operates under a low power supply voltage and a method of producing the same.

2. Description of the Related Art

Semiconductor integrated circuits have exhibited remarkable progress together with the development of fine working technique, and now, a very large scale circuit can be formed on a single semiconductor chip. One of problems involved in this is an increase in power dissipation of a semiconductor chip arising from an increase of the circuit scale. Particularly in apparatus with which importance is attached to the portability, since a battery is used as a power supply, the increase of the power dissipation may possibly create a fatal problem.

In a so-called CMOS integrated circuit, since the power dissipation when it operates increases substantially in proportion to the square of the power supply voltage, a concrete solution to the increase of the power dissipation is to make the power supply voltage lower. Further, to make the power supply voltage lower is an essential demand involved in reduction in physical dimension of a MIS field effect transistor. On the other hand, however, to make the power supply voltage lower gives rise to another problem of a drop in operation speed.

In particular, although, from the principle of operation of a MIS field effect transistor, the amount of the driving current increases in proportion to the amount of charge produced in a channel region of the transistor, the amount of charge also increases in proportion to the "input gate voltage—threshold voltage". In a standard CMOS circuit, the maximum input voltage is equal to the power supply voltage. Accordingly, as the power supply voltage is made lower until it approaches the threshold voltage, the driving current of the MIS field effect transistor decreases, and consequently, the operation speed decreases rapidly.

In order to eliminate this problem, as the power supply voltage decreases, the threshold voltage of the MIS field effect transistor must be made lower simultaneously.

However, the sub threshold current of the MIS field effect transistor exponentially relies upon the gate voltage, and in order to suppress the off current of the transistor to a level at which no problem occurs, the threshold voltage of the MIS field effect transistor cannot be set very low. Particularly, the limit value to the threshold voltage is approximately 0.4 volt in absolute value.

In order to solve those contradictory problems, several solutions have been proposed.

One of the solutions is a method wherein a power supply is cut off as disclosed in Matsutani et al., "1 V, 10 MHz High-Speed Digital Circuit Technology with Multi-Threshold CMOS", TECHNICAL REPORT OF IEICE, ICD 93-107, pp.23–27. A logic circuit is formed from transistors having a low threshold voltage, and an integrated circuit operates at a high speed. Mean-while, when the integrated circuit is not in an operating condition, the power supply is disconnected by means of a switch to prevent an unnecessary current from flowing. Where this construction is employed, the threshold voltage of the transistors can be set independently of the sub threshold current.

Another one of the solutions is a method wherein a deep substrate bias is applied to transistors to raise the threshold voltage of the transistors. The leak currents of the transistors can be reduced thereby. This method is disclosed, for example, in Japanese Patent Laid-Open No. Hei 3-82151 and Japanese Patent Laid-Open No. Hei 5-108194.

The methods described above, however, have various problems.

With the former method, a switch for disconnecting the power supply is required. While, in an ordinary integrated circuit, it cannot be avoided to use a transistor for the switch, in order to realize an insertion loss which makes no problem in practical use, the on-resistance of the transistor must be made very low, and to this end, an overhead of a large area is required. The former method also has another problem in that data stored in latch circuits or like elements are all lost by disconnection of the power supply.

In order to avoid this problem, in the former method, the latch circuits must be connected to the power supply by different wirings. This results in increase in complication in designing.

In the latter method, power consumption in a substrate bias generation circuit itself is a problem. In particular, the latter method presents a contradiction in that, when the integrated circuit is in a standby state in which the power consumption should be suppressed low, the substrate bias generation circuit must operate causing consumption of the power.

SUMMARY OF THE INVENTION

It is an object of the present invention to provide a device structure of a CMOS suitable for a low voltage operation.

According to an aspect of the present invention, there is provided a semiconductor device of a complementary MIS field effect transistor, wherein an anode of a first diode is connected to a silicon substrate of a first conduction type while a cathode of the first diode is connected to a first power supply while a cathode of a second diode is connected to a well of the other conduction type and an anode of the second diode is connected to a second power supply.

In a preferred form of the present invention, work function differences between the anodes and the cathodes of the first and second diodes are smaller than work function differences between a diffused layer of the sources of the MIS field effect transistor and the substrate.

In another preferred form of the present invention, work function differences between the anodes and the cathodes of the first and second diodes are approximately 0.5 volt.

In a further preferred form of the present invention, the semiconductor device includes a mechanism for supplying currents to the first and second diodes.

In a still further preferred form of the present invention, the mechanism for supplying currents is started in response to a chip select signal.

In a yet further preferred form of the present invention, a memory cell is provided in a well electrically isolated from the silicon substrate of the one conduction type and the well of the other conduction type.

In a yet further preferred form of the present invention, a sense amplifier is provided in a well electrically isolated from the silicon substrate of the one conduction type and the well of the other conduction type.

In a yet further preferred form of the present invention, an analog circuit is provided in a well electrically isolated from the silicon substrate of the one conduction type and the well of the other conduction type.

In a yet further preferred form of the present invention, the silicon substrate of the one conduction type is converted into the well of the one conduction type.

In a yet further preferred form of the present invention, the first and second diodes are Schottky barrier diodes.

In a yet further preferred form of the present invention, the Schottky barrier diodes are formed from Schottky contacts formed between titanium silicide and the silicon substrate.

According to a production method for a semiconductor device of the present invention, the titanium silicide mentioned above is formed simultaneously with titanium silicide on the diffused layer of the MIS field effect transistor.

According to another production method for a semiconductor device of the present invention, the titanium silicide mentioned above is formed simultaneously with a metal wiring of the MIS field effect transistor and the barrier film between silicon substrates.

In particular, according to another aspect of the present invention, there is provided a production method for a semiconductor device which includes formation of a device isolation region, implantation of an impurity and formation of a gate electrode, wherein a titanium film is formed on a surface of a diffused layer and a surface of a gate and heat treatment is performed to convert surface portions of the sourcedrain and the gate of a transistor into titanium silicide so that the titanium silicide is formed simultaneously with titanium silicide on a diffused layer of a MIS field effect transistor.

More particularly, in a production method for a semiconductor device wherein formation of a device isolation region, implantation of an impurity and formation of a gate electrode are performed successively, titanium silicide is formed simultaneously with titanium silicide on a diffused layer of a MIS field effect transistor by a process of forming a Schottky barrier diode of titanium silicide at a location in a diffused layer in which a contact hole is formed in a well region, which includes the steps of exposing the diffused layer surface and the surface of the gate, sputtering titanium to the overall area, performing heat treatment, removing the silicon and the non-reacted titanium by etching, performing heat treatment again to stabilize the titanium silicide, whereupon the surfaces of the source-drain and the gate of the transistor are converted into titanium silicide layers and also the well contact region is converted into silicide simultaneously, and then successively forming an inter-layer insulating film, a contact hole and an aluminum wiring.

According to a further aspect of the present invention, there is provided a production method for a semiconductor device which includes formation of a device isolation region, implantation of an impurity and formation of a gate electrode, wherein a process of forming a metal wiring forms titanium and titanium nitride which act as a barrier film and converts part of the titanium film into titanium silicide so that the titanium silicide is formed simultaneously with a metal wiring of a MIS field effect transistor and the barrier film between silicon substrates.

More particularly, in a production method for a semiconductor device wherein formation of a device isolation region, implantation of an impurity and formation of a gate electrode are performed successively and then an inter-layer insulating film, a contact hole and a metal wiring are successively formed, the step of forming a metal wiring includes the step of successively sputtering titanium and titanium nitride to the contact hole and performing heat treatment, and the step of sputtering a metal and working those layered films into a shape of a wiring, and the titanium and the titanium nitride under the metal film, for example, act as a barrier film to an alloy spike. In this process, the titanium film partially reacts with the silicon substrate and is converted into a titanium silicide film. Accordingly, a Schottky barrier diode of the titanium silicide is formed in the well contact region.

In the present invention, making use of the fact that the forward direction turn-on voltage of a Schottky diode of titanium silicide is approximately 0.4 V, an action which applies the potential of a well as a bias in a forward direction with respect to the potential of the source of a transistor is caused to occur. By an effect of the forward bias, the threshold voltage of a MIS field effect transistor can be controlled.

A Schottky diode necessary to construct the semiconductor device can be formed simultaneously with backing of the source-drain or the gate of silicide. Or, titanium silicide as a barrier metal of a contact area may be used as the Schottky diode.

DESCRIPTION OF THE PREFERRED EMBODIMENTS

Embodiments of the present invention are described below with reference to the drawings.

[Embodiment 1]

Figure 1:
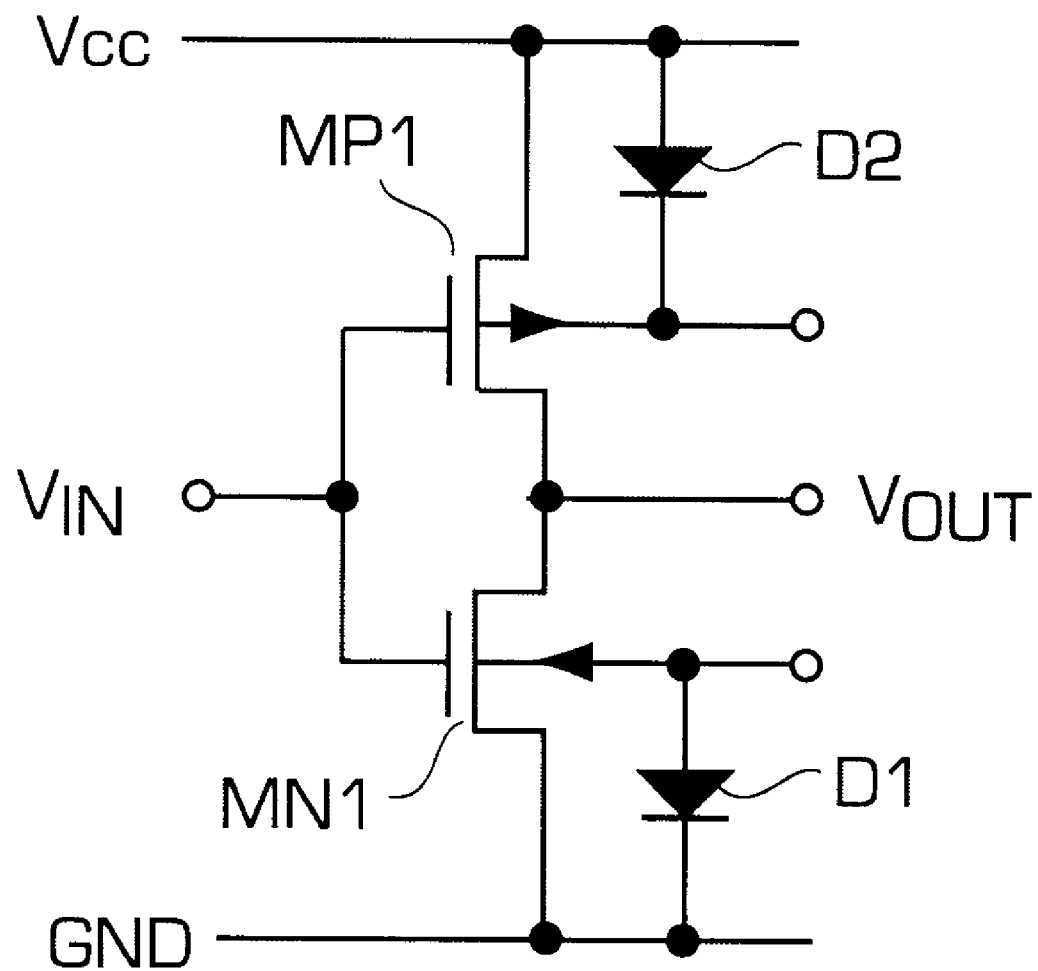
FIG. 1 is a circuit diagram of a semiconductor device showing a first embodiment of the present invention.

FIG. 1 is a circuit diagram of a semiconductor device showing a first embodiment of the present invention.

Referring to FIG. 1, an input terminal Vin is connected to the gate electrodes of a Pch-MOSFET MP1 and an Nch-MOSFET MN1. The source electrode of the Pch-MOSFET MP1 is connected to a power supply voltage Vcc, and the drain electrode of the Pch-MOSFET MP1 is connected to the drain electrode of the Nch-MOSFET MN1 and also to an output terminal Vout. The source electrode of the Nch- MOSFET MN1 is connected to a ground terminal GND. Further, a diode D1 is connected to the Pch-MOSFET MP1 while another diode D2 is connected to the Nch-MOSFET MN1.

As shown in FIG. 1, the circuit diagram of the semiconductor device shows an example wherein a CMOS inverter is formed. When the semiconductor integrated circuit is in an operating condition, the CMOS inverter flows currents through the diodes D1 and D2 to clamp the well potentials of the Pch-MOSFET MP1 and the Nch-MOSFET MN1 to work function differences between the anodes and the cathodes of the diodes. On the other hand, when the semiconductor integrated circuit is not in an operating condition, the CMOS inverter cuts off the currents to flow through the diodes. Consequently, the well potentials become equal to the source potentials, and the absolute values of the threshold voltages are held at high values.

Even if a voltage lower than a work function difference between the anode and the cathode is applied to a diode, little current flows through the diode. A clamping action of a diode makes use of this characteristic, and if a suitable current flows through a diode, then the potential difference between the opposite ends of the diode exhibits a value substantially equal to a work function difference between the anode and the cathode of the diode.

Figure 2:
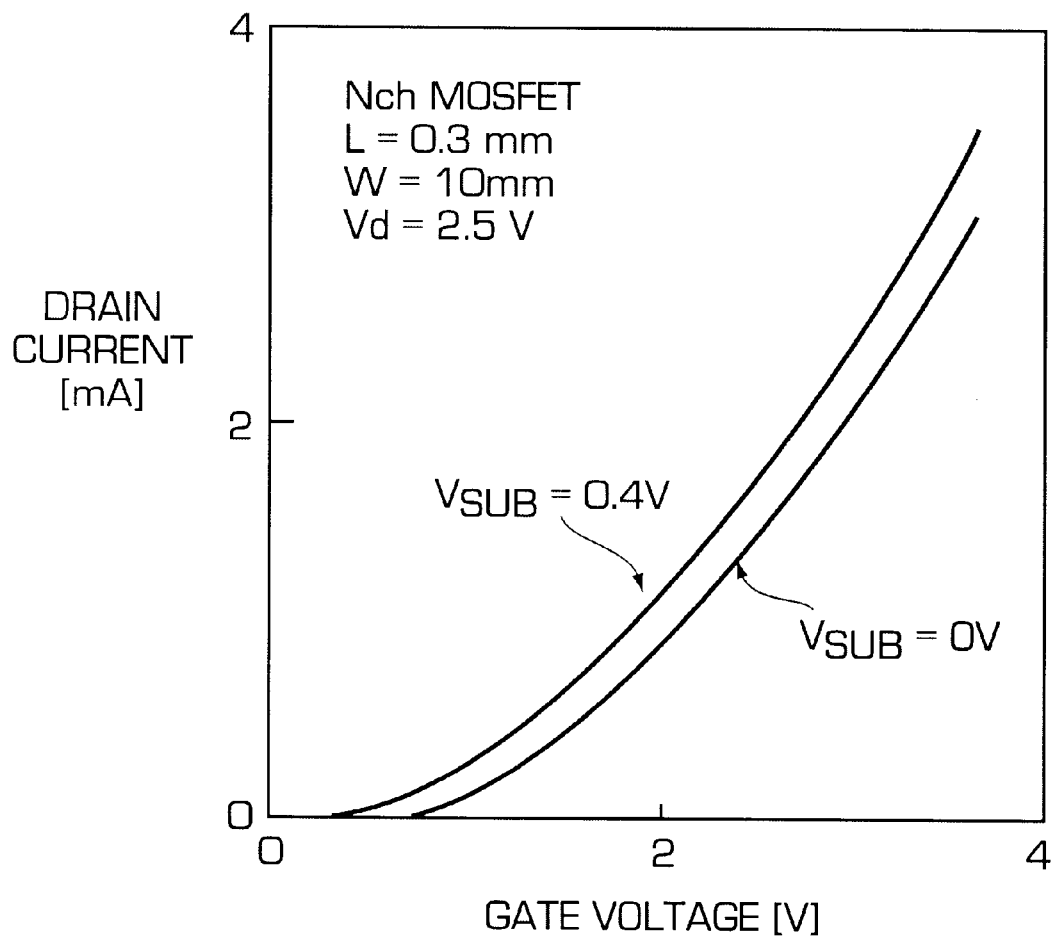
FIG. 2 is a diagram illustrating a drain current characteristic of a transistor when the substrate bias is varied.

FIG. 2 illustrates a drain current characteristic of a transistor when the substrate bias is varied. In FIG. 2, the axis of abscissa represents the gate voltage [V] while the axis of ordinate represents the drain current [mA], and the curves shown are obtained in the conditions of L 0.3 $\mu$m, W=10 $\mu$m and Vd 2.5 V of an Nch-MOSFET.

The curves in FIG. 2 illustrate a characteristic of an Nch-MOSFET when the substrate potential Vsub is biased in the forward direction and indicate that the threshold voltage is shifted in a decreasing direction by a substrate bias effect. Also a Pch-MOSFET exhibits a similar action.

In particular, when the integrated circuit is in an operating condition, the well potentials are shifted by a clamping action of the diodes to reduce the absolute values of the threshold voltages of the Nch-MOSFET and the Pch-MOSFET. Consequently, the drain currents of the transistors increase, and accordingly, the operating speed of the integrated circuit can be raised.

When the integrated circuit is not in an operating condition, since the well potentials are equal to the source potentials, the threshold voltages of the transistors can be kept sufficiently high, and consequently, the off currents can be reduced.

While, in the present invention, currents must flow through the diodes only when the integrated circuit operates as described above, the sources for the currents can be obtained from the MOSFETs themselves. In particular, when a drain current flows through a MOSFET as a result of a switching operation, substrate current is produced by an influence of a high electric field in the inside of the transistor. In a CMOS LSI formed from MOSFETs, the transistors are successively switched on. Accordingly, the substrate current produced from the transistors exhibits, when averaged, a substantially fixed current amount. This current serves as the current which drives the diodes.

When the CMOS circuit is not in an operating condition, no drain current flows through the transistors, and consequently, no substrate current is produced and the currents flowing through the diodes are substantially zero.

Figure 3:
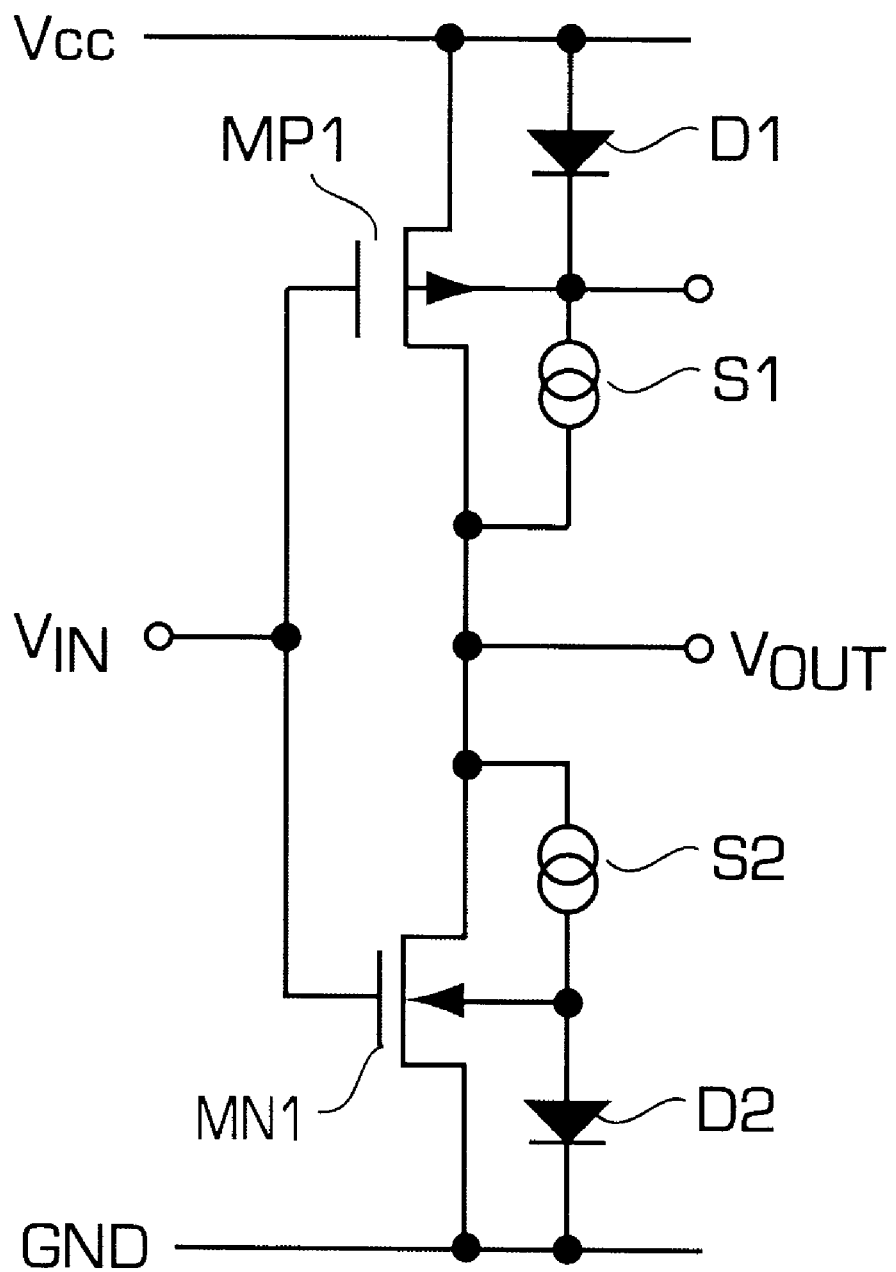
FIG. 3 is a circuit diagram of the semiconductor device to which current sources by substrate current are added.

FIG. 3 shows an equivalent circuit in this instance. As seen in FIG. 3, the diodes D1 and D2 serve as current sources S1 and S2 by impact ionization.

In the equivalent circuit of FIG. 3, when the integrated circuit operates, necessary currents for the wells flow, but when the integrated circuit stands by, the currents through the wells are off. This action is performed autonomously and requires no special circuit for exclusive use.

In order to allow the integrated circuit according to the present invention to operate regularly, the work function differences between the anodes and the cathodes of the diodes D1 and D2 are preferably smaller than the work function differences between the sourcedrain diffusion layers of the MIS field effect transistors and the substrate. Where the work function differences between the anodes and the cathodes of the diodes D1 and D2 are larger than the work function differences between the source-drain diffusion layers of the MIS field effect transistors and the substrate, it sometimes occurs that the sources-substrate-drains are put into a conducting state by the well bias, and the power supply current by the current path may possibly increase to deteriorate the original advantages of the present invention.

Figure 4:
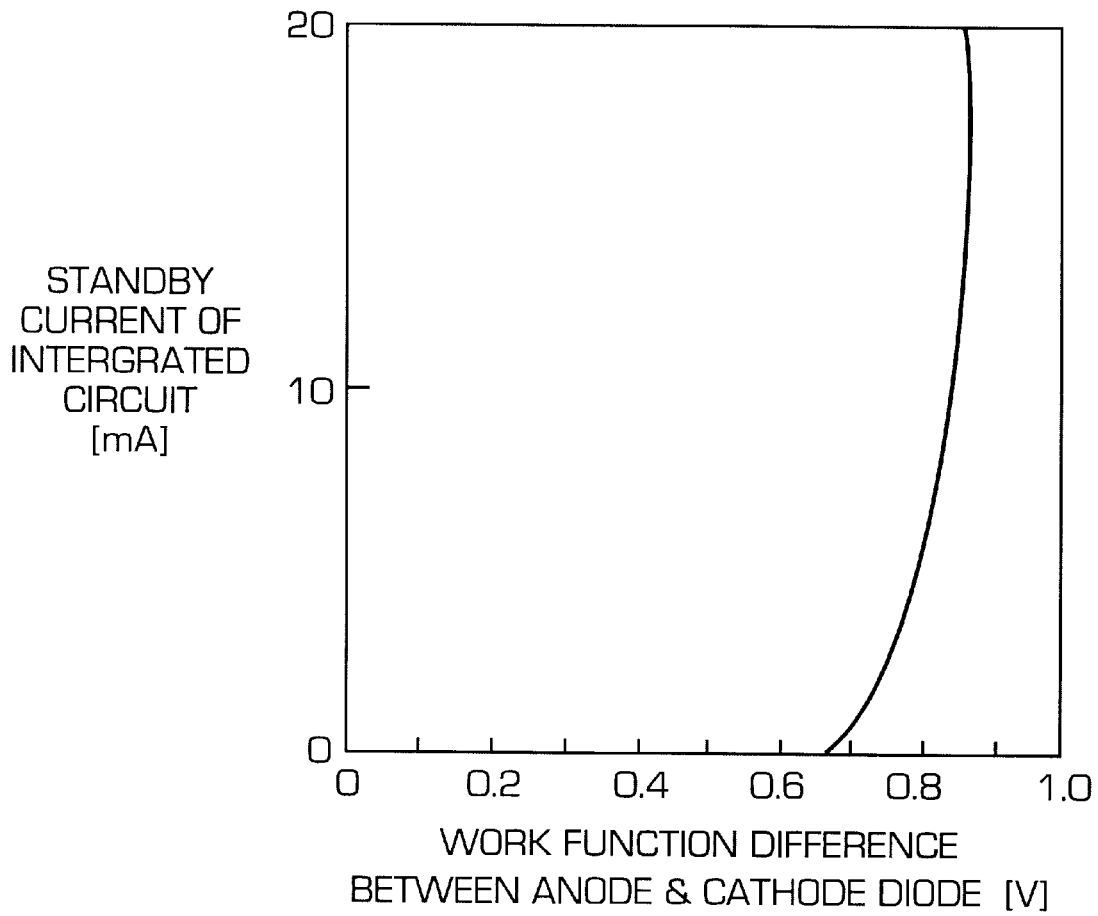
FIG. 4 is a diagram illustrating a relationship between a work function difference between the anode and the cathode of a diode and a standby current of an integrated circuit.

FIG. 4 is a diagram illustrating a relationship between the work function difference between the anode and the cathode of a diode and a current of an integrated circuit in a standby state. In FIG. 4, the axis of abscissa represents the work function difference [V] between the anode and the cathode of the diode, and the axis of ordinate represents the standby current [$\mu$A] of the integrated circuit.

It can be seen from FIG. 4 that the current in a standby state increases suddenly after the work function difference between the anode and the cathode of the diode exceeds 0.7 V. On the other hand, it is apparent that the effects of the present invention decrease as the work function difference between the anode and the cathode of the diode decreases. Accordingly, in the present invention, the work function difference between the anode and the cathode of the diode is preferably set to approximately 0.5 V.

[Embodiment 2]

Figure 5A:
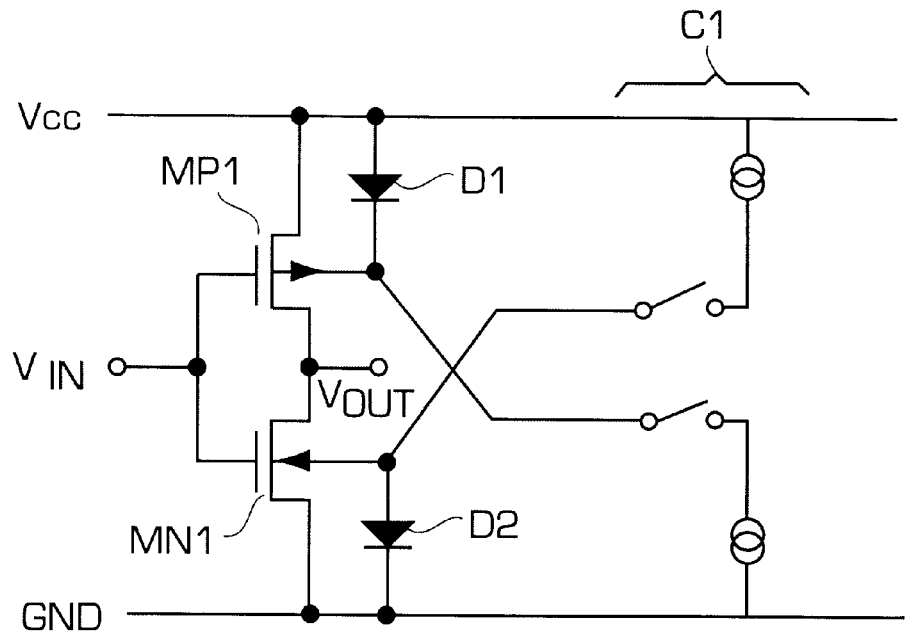
FIGS. 5(a) and 5(b) are circuit diagrams of semiconductor devices showing a second embodiment of the present invention.
Figure 5B:
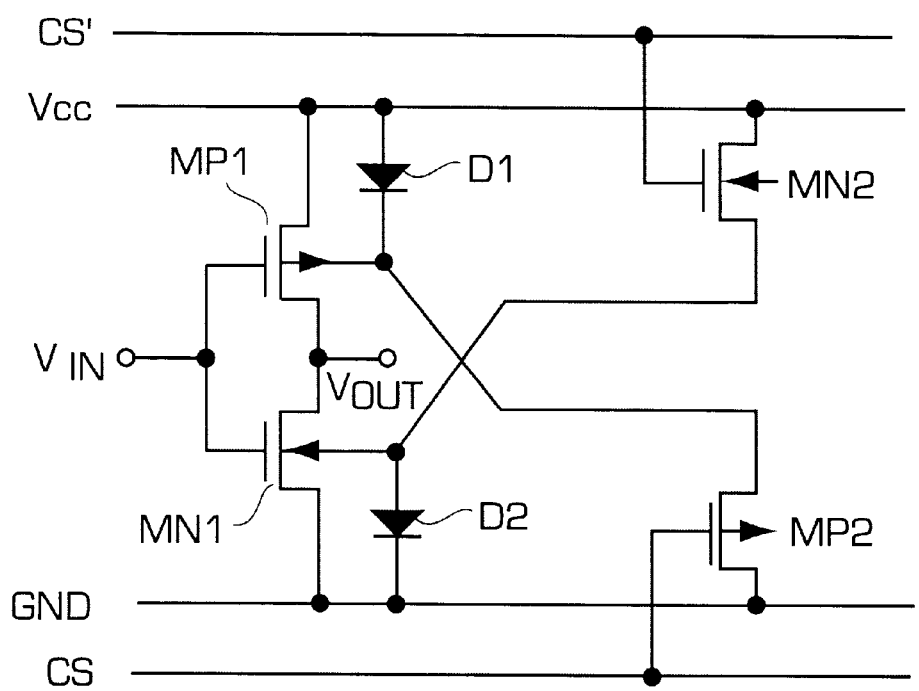

FIGS. 5(a) and 5(b) show a second embodiment of the present invention. As shown in FIGS. 5(a) and 5(b), a circuit C1 for exclusive use for supplying a diode current is provided for each of the diodes D1 and D2.

This second embodiment includes the circuit C1 for exclusive use for controlling currents to flow through the diodes and is advantageous in that, while, in the first embodiment, a time lag occurs inevitably until the substrate current of a MOSFET clamps the well potential, this defect does not occur with the second embodiment because current to flow through the diodes is controlled by an external circuit.

Further, the effects of the invention can be achieved also where the power supply voltage is made lower, for example, to or around 1 V and little substrate current is produced.

In the second embodiment, the signal for controlling on-off of the currents preferably is a chip select signal or a signal synchronized with the chip select signal. This makes it possible to keep the power dissipation of the integrated circuit to its minimum level except when higher power dissipation is required. Further, before the integrated circuit starts its operation, clamping of the well potentials can be completed.

Naturally, also the employment of the substrate bias by an external circuit in the second embodiment and the substrate bias making use of the substrate current in the first embodiment described hereinabove provides a construction which exhibits the effects of the present invention to the utmost.

[Embodiment 3]

Figure 6:
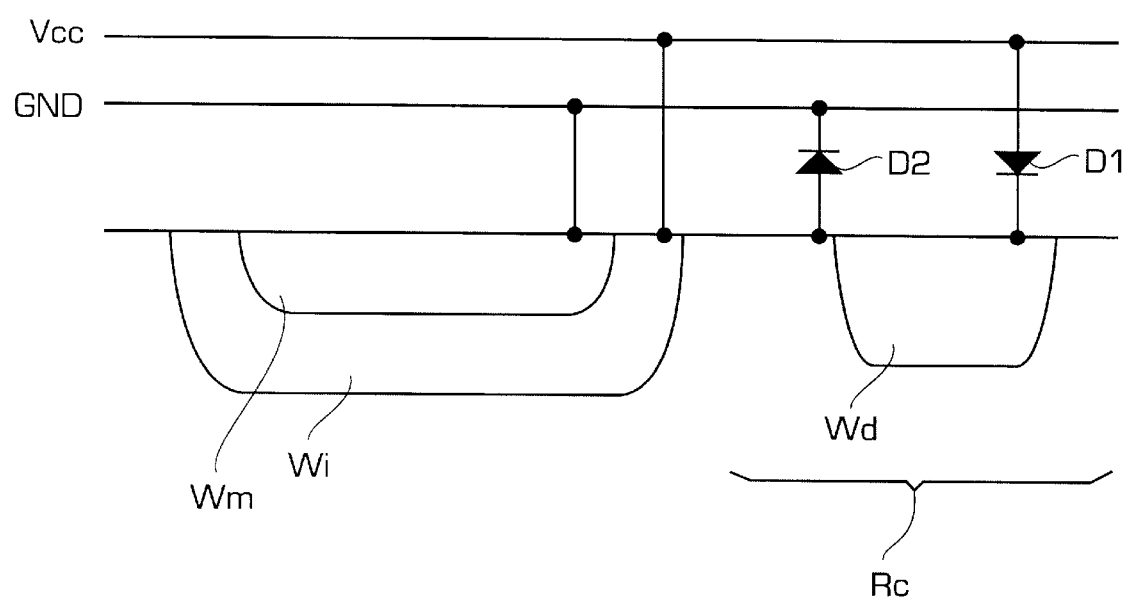
FIG. 6 is a circuit diagram of a further semiconductor device showing a third embodiment of the present invention.

FIG. 6 shows an example wherein the present invention is applied to a semiconductor memory.

In the third embodiment, a memory cell is provided in a well Wm electrically isolated by a well Wi for isolation from a well Wd which is subject to a potential clamping action by a diode. The potential of the well Wm in which the memory cell is provided is fixed to a potential of a power supply line. For the memory cell, stability in holding of data is strongly sought by increasing the driving currents for the transistors.

For example, in an SRAM cell, a leak current through the Pch MOSFET and the Nch MOSFET must be little. Meanwhile, in a DRAM cell, if the off current of the path transistors is not sufficiently low, charge accumulated in a capacitor is lost.

Accordingly, the memory cell is placed in the well Wm whose well potential is fixed while a circuit such as an I/O circuit or a word driver is disposed in a region Rc which undergoes a potential clamping action of a diode. Where the structure just described is employed, the absolute values of the threshold values of the transistors in the memory cell region can always be kept high to raise the stability of the memory cell.

Further, in the circuit region for which a driving capacity for the transistors is required, the threshold voltage of the transistors upon operation can be made low.

[Embodiment 4]

Figure 7:
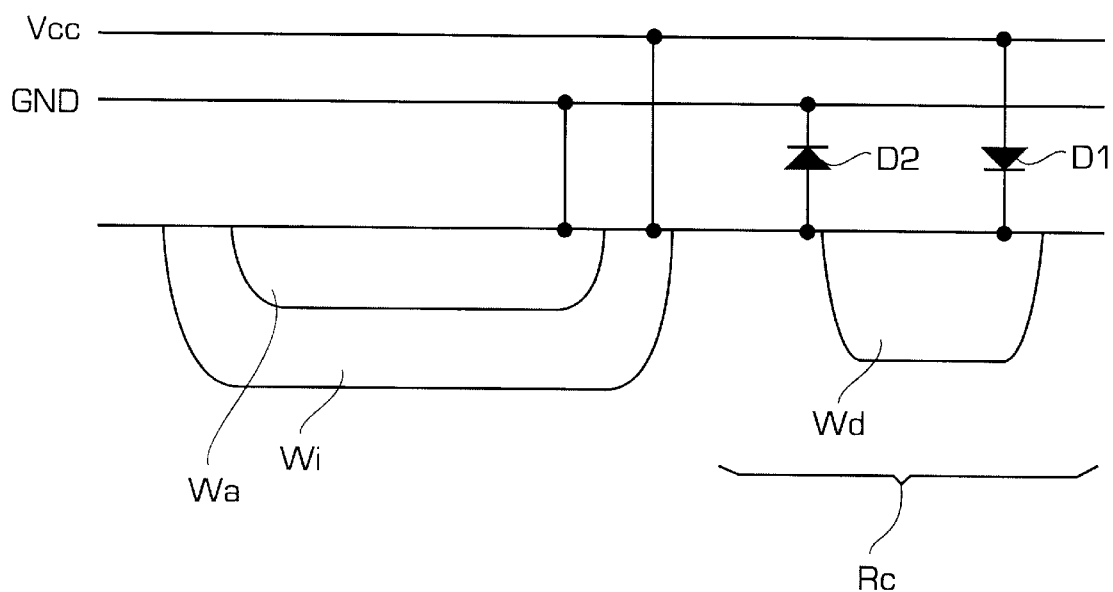
FIG. 7 is a circuit diagram of a still further semiconductor device showing a fourth embodiment of the present invention.

FIG. 7 shows another example wherein the present invention is applied to a semiconductor memory.

In the present fourth embodiment, a sense amplifier is provided in a well Wa electrically isolated by a well Wi for isolation from a well Wd which is subject to a potential clamping action of a diode. In a semiconductor memory, operation with a very high degree of accuracy is required for a sense amplifier circuit. Accordingly, similarly to a memory cell, the sense amplifier is preferably placed in the well Wa whose well potential is fixed while a circuit such as an I/O circuit or a word driver is disposed in a region Rc which is subject to a potential clamping action of a diode. Where this structure is employed, the threshold voltage of the transistors of the sense amplifier region can always be kept fixed to raise the stability of the sense amplifier. Besides, in the circuit region for which a driving capacity for the transistors is required, the threshold voltage of the transistors upon operation can be made low.

[Embodiment 5]

Figure 8:
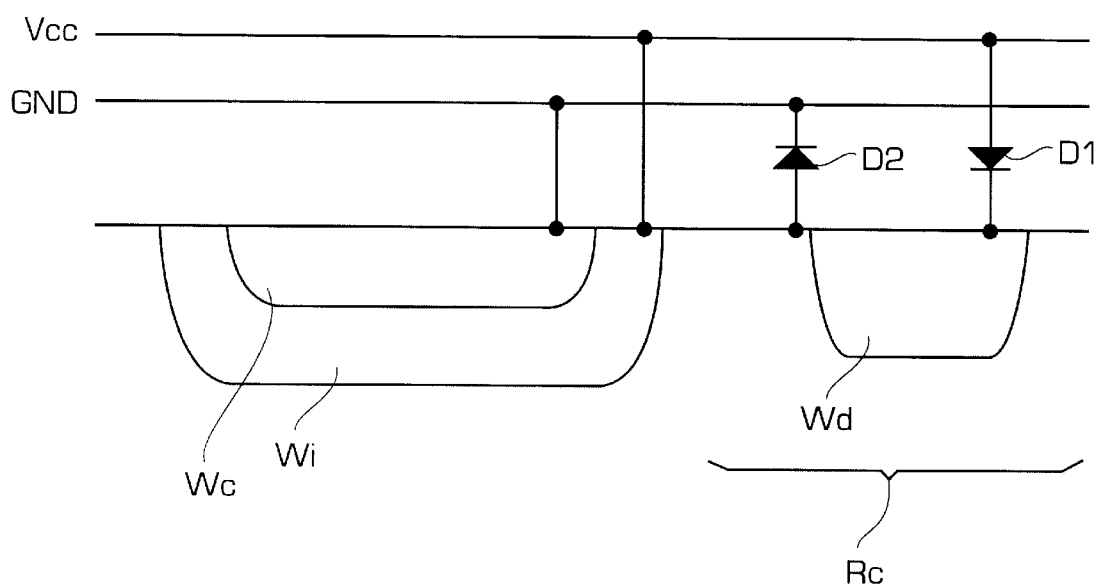
FIG. 8 is a circuit diagram of a yet further semiconductor device showing a fifth embodiment of the present invention.

FIG. 8 shows an example wherein the present invention is applied to an integrated circuit including both of digital and analog elements.

In the present fifth embodiment, an analog circuit is provided in a well Wc electrically isolated by a well Wi for isolation from a well Wd which is subject to a potential clamping action of a diode. In an integrated circuit which includes both of digital and analog elements, operation with a very high degree of accuracy is required for the analog circuit.

Accordingly, the analog circuit is preferably placed in the well Wc whose well potential is fixed while an I/O circuit and the digital circuit are disposed in a region Rc which is subject to a potential clamping action of the diodes.

Where the structure just described is employed, the threshold voltage of transistors of the analog circuitry can always be kept fixed to raise the stability and the accuracy. Further, in the digital circuitry for which a driving capacity of the transistors is required, the threshold voltage of transistors upon operation can be made low.

The embodiments described above are all described as a combination of a silicon substrate of one conduction type and a well of the other conduction type. However, it is a matter of course that the effects of the present invention can be achieved also by a combination of a well of one conduction type and another well of the other conduction type.

[Embodiment 6]

Figure 9:
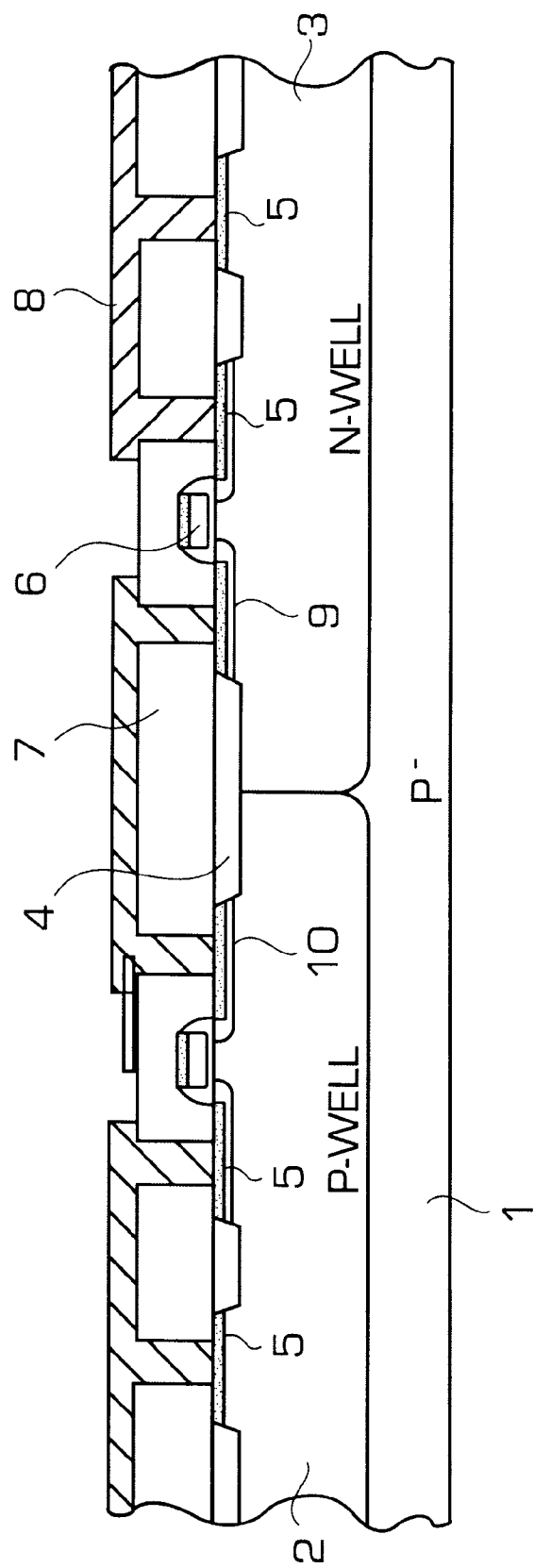
FIG. 9 is a cross sectional view of a structure of a semiconductor device showing an embodiment of the present invention.

FIG. 9 is a cross sectional view of a structure of an embodiment of a semiconductor device of the present invention.

In FIG. 9, a diode employed in the present embodiment is a Schottky barrier diode between titanium silicide and a silicon substrate.

As shown in FIG. 9, a P well 2 and an N well 3 are formed on a p-type silicon substrate 1. Further, a device isolation oxide film 4, a p-type diffused layer 9, an n-type diffused layer 10, titanium silicide 5, a gate electrode 6, an inter-layer insulation film 7 and an aluminum wiring 8 are formed on the p-type silicon substrate 1.

According to the embodiment shown in FIG. 9, a structure necessary for the present invention can be realized most simply. In particular, it is only required to provide a titanium silicide layer immediately below a contact hole provided in order to fix a well potential. Also in this instance, a Schottky barrier is formed by an interface between the silicon layer of the well and the titanium silicide.

Two methods are available to obtain the structure of the semiconductor device of the present invention.

According to one of the methods, a Schottky barrier diode by titanium silicide is formed in a diffused layer in which a contact hole is formed in the well region. Upon formation of a device, formation of a device isolation region, implantation of an impurity and formation of a gate electrode are performed successively. Thereafter, ion implantation for formation of the source-drain is performed. In this instance, it is a conventional practice that ion implantation to form a P-type diffused layer in a P-well region and form an N-type diffused layer in an N-well region is performed, and a power supply line is connected to the diffused layers.

In contrast, in the present invention, the ion implantation to implant an impurity into those regions (well contact regions) is not performed. But, subsequent to the steps described above, an impurity is activated and a well-known titanium silicide process is performed. In particular, the diffused layer surface and the polysilicon surface of the gate are exposed and titanium is sputtered to the overall area, and heat treatment is performed at a temperature at or around 700° C., whereafter the silicon and the non-reacted titanium are removed by etching and then heat treatment is performed again at a temperature at or around 850° C. to stabilize the titanium silicide. By the process, the surfaces of the source-drain and the gate of the transistor are converted into titanium silicide layers. Simultaneously, also the well contact region is converted into silicide. Thereafter, an inter-layer insulating film, a contact hole and an aluminum wiring are successively formed. By the process, the semiconductor device described hereinabove with reference to FIG. 9 is obtained.

The other method is as follows. Formation of a device isolation region, implantation of an impurity and formation of the gate electrode are performed successively. Thereafter, ion implantation for formation of the source-drain is performed. In this instance, it is a conventional practice that ion implantation to form a P-type diffused layer in a P-well region and form an N-type diffused layer in an N-well region is performed, and a power supply line is connected to the diffused layers.

In contrast, in the present invention, the ion implantation to implant an impurity into those regions (well contact regions) is not performed. But, subsequent to the steps described above, a process for activating an impurity is performed. Then, an interlayer insulating film, a contact hole and an aluminum wiring are formed successively. In this instance, the step of forming an aluminum wiring includes the step of successively sputtering titanium and titanium nitride to the contact hole, the step of performing heat treatment at or around 650° C., the step of sputtering aluminum and the step of working those layered films into a shape of a wiring.

The titanium and the titanium nitride under the aluminum film act as a barrier film to an alloy spike. In this process, the titanium film partially reacts with the silicon substrate and is converted into a titanium silicide film. Accordingly, a Schottky barrier diode of the titanium silicide is formed in the well contact region.

As described above, the present invention is advantageous in that the threshold voltage of a field effect transistor varies in response to an operation condition and low power dissipation in a standby state and a high speed in operation of an integrated circuit are realized simultaneously.

What is claimed is:

1. A semiconductor device of a complementary MIS field effect transistor, wherein an anode of a first diode is connected to a silicon substrate well of a first conduction type while a cathode of said first diode is connected to a first power supply while a cathode of a second diode is connected to a silicon substrate well of the other conduction type and an anode of said second diode is connected to a second power supply.

2. A semiconductor device as claimed in claim 1, which includes a mechanism for supplying currents to said first and second diodes.

3. A semiconductor device as claimed in claim 1, wherein said first and second diodes are Schottky barrier diodes.

4. A semiconductor device as claimed in claim 2, wherein said mechanism for supplying currents is started in response to a chip select signal.

* * * * *